United States Patent [19]

Lankreijer

[11] Patent Number: 5,159,337
[45] Date of Patent: Oct. 27, 1992

[54] SELF-ALIGNING SAMPLING SYSTEM AND LOGIC ANALYZER COMPRISING A NUMBER OF SUCH SAMPLING SYSTEMS

[75] Inventor: Willem Lankreijer, Eindhoven, Netherlands

[73] Assignee: U.S. Philips Corp., New York, N.Y.

[21] Appl. No.: 619,848

[22] Filed: Nov. 29, 1990

[30] Foreign Application Priority Data

May 1, 1990 [NL] Netherlands ............... 9001037

[51] Int. Cl.⁵ .................. H03M 7/40; H03M 1/66; H03M 1/06
[52] U.S. Cl. ..................... 341/67; 341/120; 341/144; 341/122
[58] Field of Search ............. 341/120, 61, 67, 94, 341/155, 110, 118, 144, 122

[56] References Cited

U.S. PATENT DOCUMENTS

| | | |
|---|---|---|
| 4,345,241 | 8/1982 | Takeuchi et al. |
| 4,464,726 | 8/1984 | Chiang ............. 341/144 X |
| 4,736,189 | 4/1988 | Katsumata et al. ........ 341/120 |
| 4,763,105 | 8/1988 | Jenq ................. 341/120 |
| 4,833,445 | 5/1989 | Buchele ............. 341/120 X |
| 5,008,674 | 4/1991 | Da Franca et al. ..... 341/144 X |

OTHER PUBLICATIONS

Fluke & Philips—The Global Alliance in Test & Measurement, "An ABC Of Logic Analysis", pp. 1–37.

*Primary Examiner*—Sharon D. Logan
*Attorney, Agent, or Firm*—Jack D. Slobod

[57] ABSTRACT

A self-aligning sampling system for sampling digital signals, for example in a logic analyzer includes an adjustable delay line fed by a system clock signal which delay line has tapping points for further clock signals. In conjunction with the system clock, the further clock signals are used to take several samples of the digital signal in a time slot of the system clock. In order to achieve equidistant sampling even in the case of a large process spread in elementary delay units of the delay line, the delay line is calibrated. The system clock is then connected to the data input and expressed in elementary delay units on the basis of measurement. Subsequently, the delay line between clock signal tapping points is adjusted on the basis thereof.

13 Claims, 3 Drawing Sheets

SELF-ALIGNING SAMPLING SYSTEM AND LOGIC ANALYZER COMPRISING A NUMBER OF SUCH SAMPLING SYSTEMS

BACKGROUND OF THE INVENTION

1. Field of the Invention

The invention relates to a signal sampling system which is self-aligning. In its more particular aspects the present invention relates to such a system which includes a clock input for receiving a system clock signal, an adjustable delay line which is coupled to the clock input and which comprises tapping points for tapping delayed clock signals, a sampling circuit having clock inputs for receiving the system clock signal and the delayed clock signals and at least one signal input for receiving at least one signal to be sampled, and adjusting means for adjusting the delay line so that equidistant sampling instants are obtained.

The invention also relates to a logic analyser comprising a number of input channels for receiving digital signals.

2. Description of the Related Art

A logic analyser is an instrument for collecting and tracking groups of digital signals in order to test the operation of a digital system such as a microprocesor system. A large number of digital signals are collected and information regarding the digital signals is displayed on a display screen, for example as logic values "1" and "0" or as a time sequence diagram with high-low signal representation. The logic analyser may be a stand-alone instrument or may be combined with another apparatus such as a digital storage oscilloscope or a pattern generator; it may also be included as an instrument-on-card in a system. Generally, a logic analsyser will be suitable for executing so-called state analysis as well as timing analysis. In the case of timing analysis, signal transitions from "0" to "1" and "1" to "0" are observed in a time sequence diagram in which a number of digital signals are represented. In the case of logic timing analysis, digital signals of a digital system to be tested are asynchronously sampled, the resolution being determined by the sampling frequency.

U.S. patent Specification No. 4,763,105 discloses a self-aligning sampling system for the sampling of signals, comprising a clock input for receiving a system clock signal, an adjustable delay line which is coupled to the clock input and which comprises tapping points for tapping delayed clock signals, a sampling circuit comprising clock inputs for receiving the system clock signal and the delayed clock signals and a signal input for receiving a signal to be sampled, adjusting means for adjusting the delay line so that equidistant sampling instants are obtained, and programmed arithmetic means for generating adjusting signals for the adjusting means. It concerns a sampling system for inter alia digital storage oscilloscopes in which a number of sampling circuits operate in parallel in order to achieve a high effective sampling frequency. Each sampling circuit thereof is supplied with a clock signal derived from a system clock signal. The clock signals are tapped from a delay line. In a data acquisition memory sampling values of an in this case analog signal are stored in an interleaved fashion. In order to obtain sampling instants which are as equidistant as possible, the delay line is rendered adjustable. The delay line is calibrated via an automatic calibration procedure during which a sinusoidal voltage of known amplitude and frequency is presented to the sampling system as a calibration signal. The calibration procedure is executed by means of programmed arithmetic means and essentially comprises the following steps. M sampling circuits which comprise analog-to-digital converters, for example M=6, and which are coupled to the delay line, take I samples, for example I=16. The I.M samples of the analog calibration signal are stored as data in an acquisition memory. From the data set of I.M samples, being weighted first using a Blackman-Harris window, a frequency spectrum is determined by Fourier transformation, this frequency spectrum is used to derive a further complex data set containing peak information of the frequency spectrum. The complex data set is subjected to inverse Fourier transformation and from the resultant complex data set in the time domain phase information representative of an incorrectly adjusted delay line is derived. The delay line sections are adjusted on the basis of this phase information. The calibration procedure followed is complex and intricate and, moreover, is suitable only for analog sampling systems.

SUMMARY OF THE INVENTION

It is an object of the invention to provide a self-aligning sampling system of the kind set forth which is suitable for the sampling of digital signals, utilizes a simple calibration procedure, and is also suitable for use in, for example a logic analyser.

To achieve this, a self-aligning sampling system in accordance with the invention is characterized in that the signal to be sampled is a digital signal, the sampling system comprising an acquisition memory for the storage of sampling values of the digital signal, the programmed means also being suitable for expressing the system clock signal in elementary units of the delay line, starting from an initial state of the delay line and while applying the system clock signal to one of the signal inputs, and for subsequently generating adjusting signals such that the expressed elementary units are distributed in proportion between the tapping points on the delay line. Starting from an initial state of, for example one elementary unit of the delay line between each clock signal tapping point, the system clock which is connected to the signal input is sampled. A first sampling value coincides with a positive going edge of the system clock and further sampling values are within the subsequent system clock period. In the case of a symmetrical clock pulse, the last sample, for example the eighth sample, will occur in the high or low state of the clock pulse for such a delay line adjusted for minimum delay, depending on the magnitude of the elementary delay unit, due to process spreads. It is to be noted that in the case of construction in IC technology, for example as an ASIC (Application Specific Integrated Circuit), a large process spread occurs, i.e. the spread in the elementary delay unit is large, even as large as a factor of six, so that in principle adjustment is not possible. Furthermore, the system clock frequency and the adjusting range of the delay line should be matched, i.e. for a minimum adjustment all sampling instants should be within one system clock period in worst case as well as in best case situations. Subsequently, further elementary elements are added to the delay line until the last sample changes from low to high or from high via low to high. This means that the system clock period is known as a number of elementary delay units within the accuracy of one unit. Subsequently, this number is distributed in proportion between the tapping points on the delay line, for example in the case of seven further clock signals in ⅛, 2/8 etc. of the given number. The adjustments determined are placed in latches per tapping point and also in a non-volatile memory, so that recalibration need not take place when the sampling system is activated again after having been switched off. The calibration procedure could be initiated, for example by way of a so-called "green button".

An embodiment of a self-aligning sampling system in accordance with the invention is characterized in that the sampling circuit comprises sampling data flip-flops having interconnected data inputs for receiving the signal to be sampled and clock inputs for receiving the clock signals. A digital signal is thus sampled ("0" or "1") at equidistant instants within one clock pulse period.

A further embodiment of a self-aligning sampling system in accordance with the invention is characterized in that outputs of the sampling data flip-flops are coupled to an equalizer to be clocked by the system clock or by clocks derived from the system clock. The sampling values of the digital signal are thus propagated per system clock period.

An embodiment of a self-aligning sampling system in accordance with the invention is characterized in that the delay line comprises an additional clock signal tapping, the sampling circuit comprising an additional sampling data flip-flop and a multiplexer which is connected between the preceding and the additional sampling data flip-flop and the last equalizer data flip-flop, the programmed arithmetic means also being suitable for controlling the multiplexer during calibration of the delay line so that the additional sampling data flip-flop is connected to the equalizer. When the delay between tapping points is proportionally incremented, no further calculation will then be required after determination of the system clock period in elementary units. In that case the additional clock signal serves merely as a measuring clock.

A logic analyser comprising self-aligning sampling systems in accordance with the invention includes, for example 96 input channels for timing analysis. For example, if one ASIC is required for 16 channels, each ASIC comprises a self-aligning sampling system or at least the clock system thereof. The acquisition memory may be present in another IC. The system clock should be distributed inter alia to all ASICs comprising a self-aligning sampling system, it being necessary to calibrate such ASICs separately by means of the calibration procedure in accordance with the invention.

BRIEF DESCRIPTION OF THE DRAWING

The invention will be described in detail hereinafter with reference to a drawing; therein.

DETAILED DESCRIPTION OF THE PREFERRED EMBODIMENT

Figure 1A:
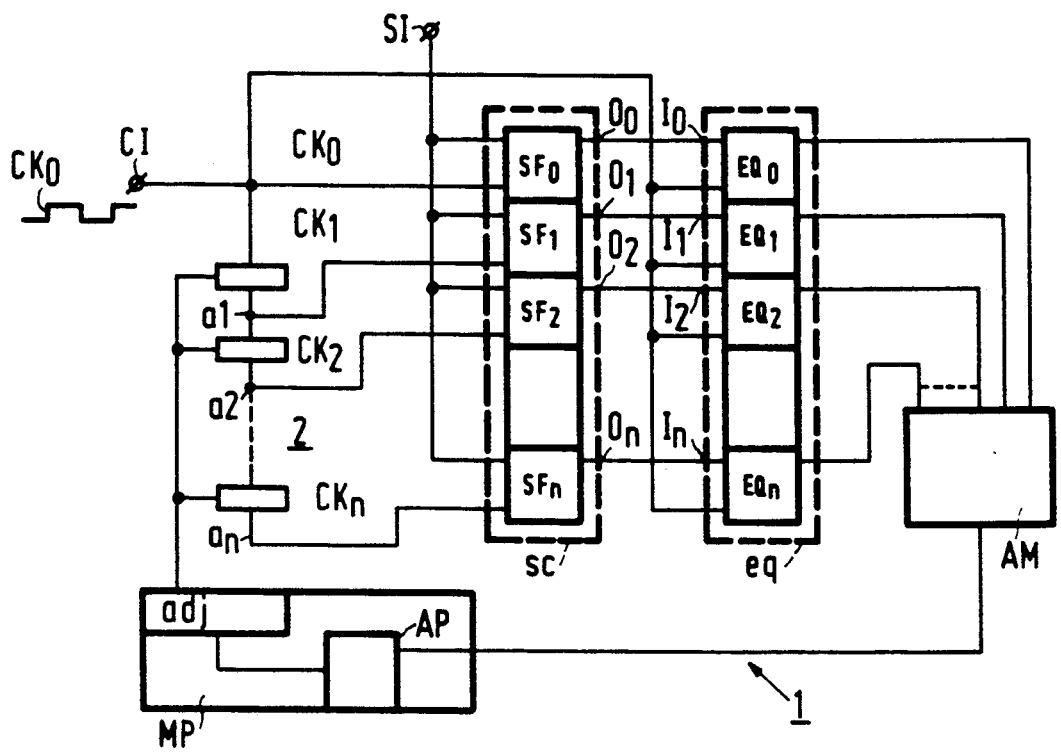
FIG. 1A shows a self-aligning sampling system in accordance with the invention.

FIG. 1A shows a self-aligning system 1 in accordance with the invention for the sampling of digital signals. The system 1 comprises a clock input CI for receiving a system clock signal CKO and a signal input SI for receiving a digital signal to be sampled. The system clock signal CK0 is delayed via an adjustable delay line 2. Delayed clock signals CK1, CK2, . . . , CKn become available on tapping points a1, a2, . . . , an; for example n=7. The clock signals CK0, CK1, . . . , CKn are applied to a sampling circuit sc. The sampling circuit consists of a number of sampling data flip-flops SF0, SF1, SF2, . . . , SFn, each of which receives the digital signal to be sampled. Because the clock signals CK0, CK1, . . . , CKn have been delayed with respect to one another, n+1 samples of the digital input signal successively appear on the outputs 00, 01, 02, . . . , 0n. For example, if n=7 and the system clock has a frequency of 50 MHz, the effective sampling or acquisition frequency is, 400 MHz. The sampling circuit is followed by a single-stage or multi-stage equalizer eq which consists, consists of equalizer data flip-flops EQ0, EQ1, EQ2, . . . , EQn in the case of a single-stage type. The outputs 00, 01, 02, . . . , 0n of the sampling circuit sc are applied to inputs I0, I1, I2, . . . , In of the equalizer eq. The clock inputs of the equalizer data flip-flops are interconnected. The system clock is applied to the equalizer data flip-flops, so that within one time slot of the system clock 8 samples are propagated to an acquisition memory AM. The acquisition memory AM is coupled to a microprocessor system MP which includes programmed arithmetic means AP which generate adjusting signals in the form of, the example binary data (for example, 8 bits) for supply to adjusting means adj. The adjusting means, to be described in detail hereinafter, serve to adjust the delay line so that equidistant sampling instants are obtained. The adjusting means adj are coupled to the adjustable delay line 2. The programmed arithmetic means incorporate a calibration procedure in accordance with the invention.

Figure 1B:
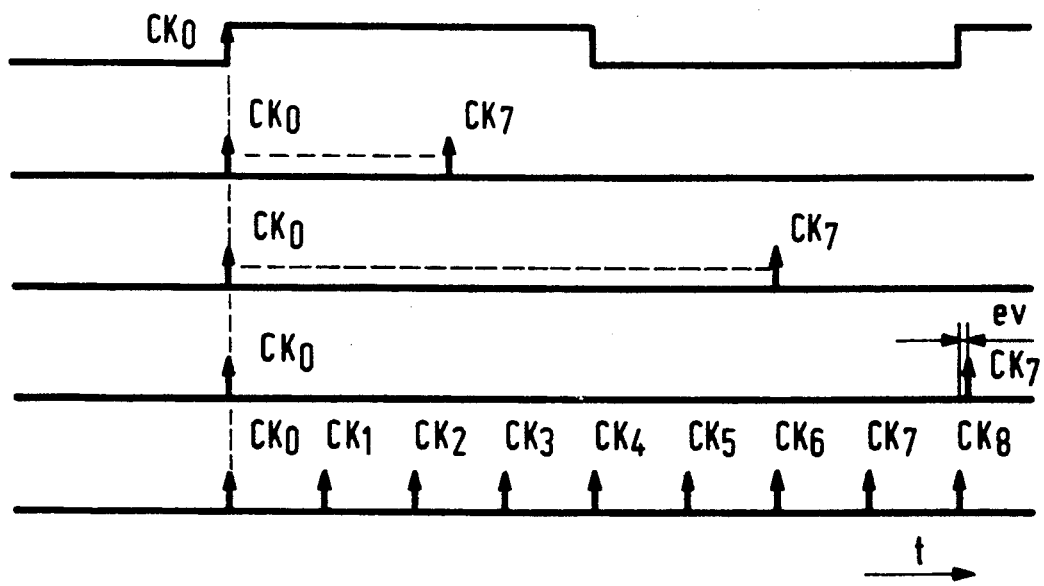
FIG. 1B shows a time sequence diagram illustrating the operation of the self-aligning sampling system in accordance with the invention.

FIG. 1B shows a time sequence diagram illustrating the operation of the self-aligning sampling system 1 in accordance with the invention. The first line shows the system clock signal CK0, for example having a duty cycle of 50%, and the second and the third line show positive going edges of the system clock signal CK0 and of the last delayed clock signal CK7 in a minimum state of the delay line 2, i.e. between sucessive clock pulse tapping points there is each time adjusted one elementary delay unit, in a "best" case situation with a comparatively small elementary delay and in a worst case situation with a comparatively large elementary delay, respectively. Depending on the IC technology or IC process used a substantial process spread may occur, that is to say up to a factor of 6. It will be evident that in principle adjustment on the basis of this process spread will not result in equidistant sampling instants. In accordance with the invention, the delay line is calibrated by way of a calibration process to be executed by the programmed arithmetic means AP, so that equidistant sampling is obtained. The associated clock edges are shown on the last line of FIG. 1B. Preferably, a minimum adjustment of the delay line as described is assumed. During calibration of the delay line the clock input CI is connected to the signal input SI. With respect to the digital input signal on the signal input SI, the positive going clock edge of the last clock signal is then present at a signal value "1" (high) or "0" (low), depending on the value of the elementary delay unit, being one gate as the case may be delay. In the best case and the worst case situation of the IC process to be chosen, for the minimum adjustment of the delay line the positive-going clock pulse edges of all clock signals should be present within one clock pulse period and the control range of the delay line should be so large that the positive-going clock pulse edge of the last clock pulse signal CK7 is situated in a next period in the case of maximum adjustment of the delay line. From the minimum adjustment of the delay line the clock pulse edge of Ck7 is shifted by activating further elementary delay units. In the memory location in the acquisition memory AM which is associated with the data fetched by way of the clock CK7, the programmed means AP test whether the data value changes from "1" via "0" to "1" or from "0" to "1", depending on the initial position of CK7. In that case, as shown on the fourth line of FIG. 1B, within the accuracy of one elementary delay unit ev the clock period of CK7 is has been shifted one system clock period and hence determined in elementary delay units, say N.ev, where N is an integer. The programmed means AP generate adjusting signals on the basis thereof, for example for n=7, implying 7 tapping points, N.ev/8, 2.N.ev/8, ..., 7.N.ev/8. During the incrementing of the delay line, only the last section of the delay line can be incremented, i.e. only the clock pulse edge of CK7 is shifted or all clock pulse edges are shifted simultaneously, or any combination thereof, determining the propagation delay.

Figure 2:
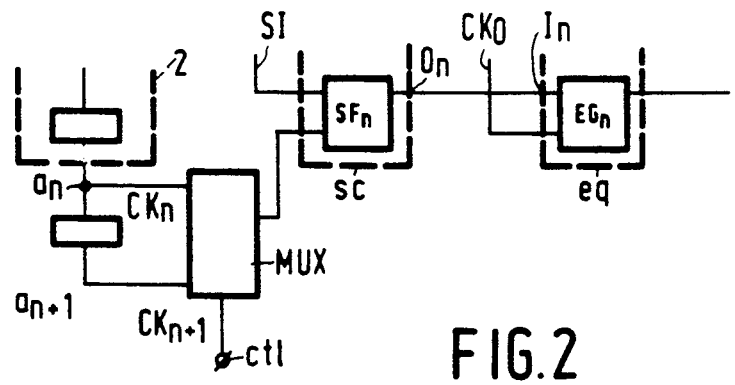
FIG. 2 shows a detail of another embodiment of the self-aligning sampling system in accordance with the invention.

In order to make a calibrated delay line available after measurement of the clock pulse period in elementary delay units, without further calculation or adjustment being required, the self-aligning sampling system is slightly modified. FIG. 2 shows a detail of such a further embodiment. Parts which correspond to those shown in FIG. 1A are denoted by corresponding references. There is an addition in the form of an additional tapping point an+1 on the delay line 2 and a multiplexer MUX whose inputs are connected to the tapping points an and an+1 and whose output is connected to the last sampling data flip-flop SFn. A control input ctl of the multiplexer MUX is connected to the microprocessor system MP. During calibration of the line 2, the multiplexer MUX is controlled so that the additional clock signal CKn+1 is applied to the clock input of the last sampling data flip-flop SFn. The fifth line of FIG. 1B shows this additional clock signal CK8 for n=7. If, starting from a minimum state of the delay line, each section of the delay line between two tapping points ai and ai+1 is incremented by the same amount, all clocks will be correct if the clock CK8 coincides substantially with the positive going clock edge of the next period of the system clock.

Figure 3A:
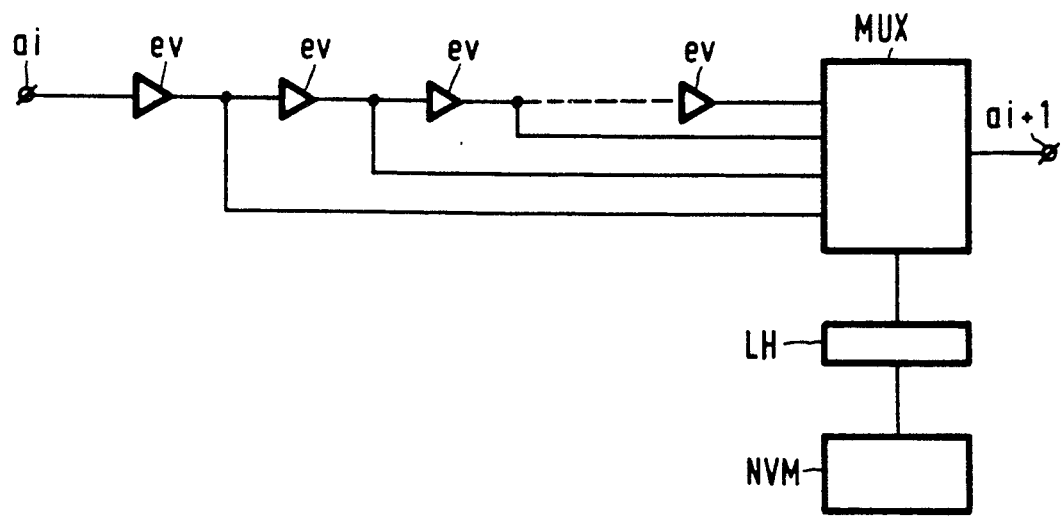
FIG. 3A and FIG. 3B show a first and a second embodiment, respectively, of a detail of the adjustable delay line between two clock tapping points.

FIG. 3A shows a first embodiment of a section of the adjustable delay line 2, viewed between two clock tapping points ai and ai+1. Such a section comprises a number of elementary delay units ev, a multiplexer MUX, a latch LH to the adjustment of the multiplexer. The latch LH is connected to a non-volatile memory NVM which is filled by the programmed arithmetic means AP.

Figure 3B:
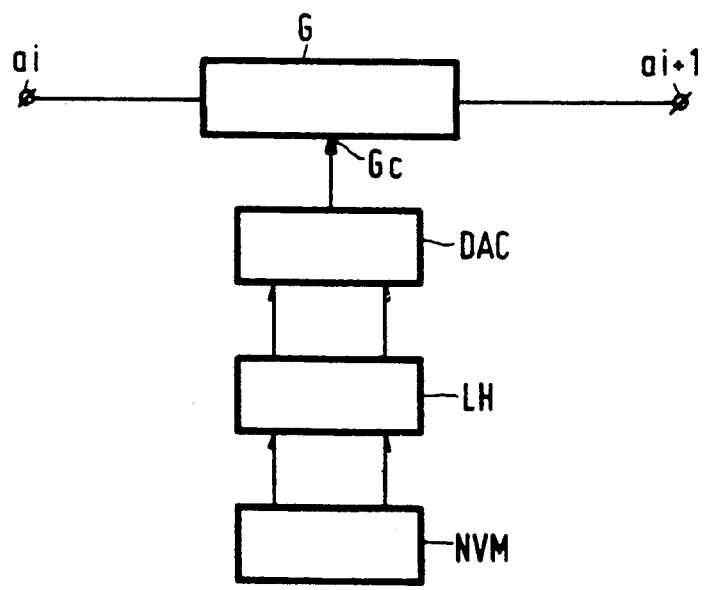

FIG. 3B shows a second embodiment of a detail of the adjustable delay line 2 between two clock tapping points ai and ai+1. Such a detail comprises a gate G with voltage-controlled propagation delay. The control input Gc is coupled to a digital-to-analog converter DAC. The non-volatile memory NVM fills latch LH which is connected to the DAC.

Figure 4:
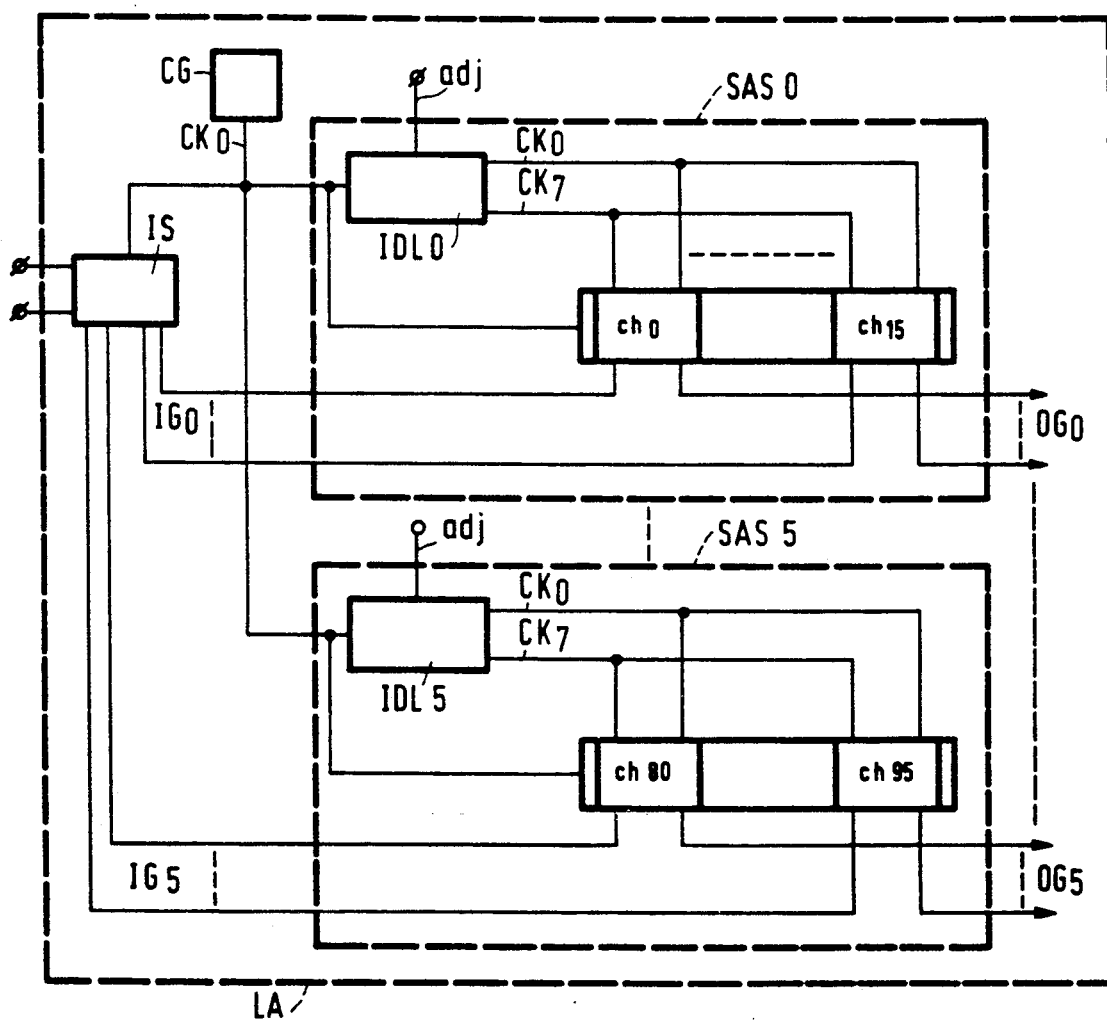
FIG. 4 shows an input section of a logic analyser including self-aligning sampling systems in accordance with the invention.

FIG. 4 shows an input section of a logic analyser LA which includes self-aligning sampling systems in accordance with the invention. It is assumed that there are 96 channels ch0 to ch95 which are simultaneously sampled and that the self-aligning sampling systems SAS0 to SAS5 are distributed between 6 ASICs, i.e. 16 channels are sampled per ASIC. There are also provided adjustable delay lines IDL0 to IDL5, each of which supplies 8 clock signals CK0 to CK7. In this case there are six groups, input signals IG0 to IG5, and per system clock period 8.16=128 samples are taken per ASIC. Therefore, there are six output groups of samples OG0 to OG5. Per system clock period 6.8.16=768 samples are applied to the acquisition memory (not shown). During the execution of the calibration procedure by means of the programmed arithmetic means, adjustments adj of the adjustable delay lines are modified. Elementary delay elements may exhibit a large spread between different ASICs. At the input side the self-aligning sampling systems SAS0 to SAS5 are coupled to the input system IS of the logic analyser which incorporates a delay which is programmable per channel in order to eliminate channel skew. It will be evident that in addition to the described circuits a logic analyser comprises a large number of other circuits such as transition detectors, glitch detectors, word recognizers etc. which are coupled to the data stream from the groups OG0 to OG5. For a more detailed description of logic analyser functions, reference is made to other literature such as "An ABC of logic analysis", Fluke and Philips, pp. 1–37 whose contents are considered to be incorporated herein. Reference is made notably to the extensive possibilities for triggering on to the data stream.

I claim:

1. A self-aligning sampling system for sampling signals, comprising a clock input for receiving a system clock signal, an adjustable delay line which is coupled to the clock input and which comprises in cascade, a series of variable delay elements alternating with tapping points for tapping delayed clock signals, a sampling circuit which comprises clock inputs for receiving the system clock signal and the delayed clock signals and also at least one signal input for receiving a signal to be sampled, adjusting means for adjusting the variable delay elements of the delay line so that equidistant sampling instants are obtained at the tapping points, and programmed arithmetic means for generating adjusting signals for the adjusting means, characterized in that the signal to be sampled is a digital signal, the sampling system comprising an acquisition memory for storing sampling values of the digital signal, the programmed means also being suitable for expressing the system clock signal in elementary units of the delay line, starting from an initial state of the delay line and while applying the system clock signal to said at least one signal input, and for subsequently generating adjusting signals to said variable delay elements such that the expressed elementary units are distributed in proportion between the tapping points on the delay line.

2. A self-aligning sampling system as claimed in claim 1, characterized in that in the initial state there is a single elementary unit of the delay line between each successive clock signal tapping point.

3. A self-aligning sampling system as claimed in claim 1, characterized in that the sampling circuit comprises a series of sampling data flip-flops having interconnected data inputs for receiving the signal to be sampled and clock inputs for receiving the system clock signal and the delayed clock signals.

4. A self-aligning sampling system as claimed in claim 3, characterized in that outputs of the sampling data flip-flops are coupled to an equalizer which is clocked by the system clock signal or by clock signals derived from the system clock signal.

5. A self-aligning sampling system as claimed in claim 4, characterized in that the equalizer comprises a series of equalizer data flip-flops whose data inputs are connected to the outputs of sampling data flip-flops.

6 A self-aligning sampling system as claimed in claim 5, characterized in that the delay line comprises an additional clock signal tapping point, the sampling circuit comprising an additional sampling data flip-flop immediately following a last sampling data flip-flop in said series of sampling data flip-flops and a multiplexer which is connected between the last sampling data flip-flop and the additional sampling data flip-flop and a last equalizer data flip-flop in said series of equalizer data flip-flops, the programmed arithmetic means also being suitable for controlling the multiplexer during calibration of the delay line so that the additional sampling flip-flop is connected to the equalizer.

7. A self-aligning sampling system as claimed in claim 1 characterized in that the adjustable delay line between clock signal tapping points is composed as a series connection of gates, the outputs thereof being connected to the inputs of a multiplexer, an output of the multiplexer being a clock signal tapping point, the multiplexer being adjustable by means of a signal generated by the programmed arithmetic means.

8. A self-aligning sampling system as claimed in claim 1, characterized in that the adjustable delay line between clock signal tapping points is a gate having a voltage-controlled delay time and being controllable by a digital-to-analog converter, the programmed means being suitable for supplying, via a latch, a digital adjusting signal for the digital-to-analog converter.

9. A self-aligning sampling system as claimed in claim 1, characterized in that after a calibration the adjustment signals are stored in a non-volatile memory.

10. A logic analyser comprising a number of input channels for receiving digital input signals, said input channels being divided into a plurality of groups each containing at least one of said input channels, coupled respectively to a plurality of self-aligning sampling systems, each self-aligning sampling system comprising: a clock input for receiving a system clock signal, an adjustable delay line which is coupled to the clock input and which comprises in cascade a series of variable delay elements alternating with tapping points for tapping delayed clock signals, a sampling circuit which comprises clock inputs for receiving the system clock signal and the delayed clock signals and also one or more signal inputs for receiving the digital input signals to be sampled, adjusting means for adjusting the variable delay elements of the delay line so that equidistant sampling instants are obtained, and programmed arithmetic means for generating adjusting signals for the adjusting means characterized in that the signal to be sampled is a digital signal, the sampling system comprising an acquisition memory for the storage of sampling values of the digital signal, the programmed means also being suitable for expressing the system clock signal in elementary units of the delay line, starting from an initial state of the delay line and while applying the system clock signal to one of the signal inputs, and for subsequently generating adjusting signals such that the expressed elementary units are distributed in proportion between the tapping points on the delay line.

11. A logic analyser as claimed in claim 10, characterized in that each self-aligning sampling system comprises an Application Specific Integrated Circuit (ASIC).

12. A self-aligning sampling system as claimed in claim 3, characterized in that in the initial state there is a single elementary unit of the delay line between each successive clock signal tapping point.

13. A self-aligning sampling system as claimed in claim 4, characterized in that in the initial state there is a single elementary unit of the delay line between each successive clock signal tapping point.

* * * * *